US010600855B2

(12) United States Patent
Song et al.

(10) Patent No.: US 10,600,855 B2
(45) Date of Patent: Mar. 24, 2020

(54) ORGANIC LIGHT-EMITTING DISPLAY APPARATUS

(71) Applicant: Samsung Display Co., Ltd., Yongin-si, Gyeonggi-do (KR)

(72) Inventors: Hagyeong Song, Yongin-si (KR); Deukjong Kim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 9 days.

(21) Appl. No.: 15/591,775

(22) Filed: May 10, 2017

(65) Prior Publication Data

US 2017/0345883 A1   Nov. 30, 2017

(30) Foreign Application Priority Data

May 31, 2016   (KR) .......................... 10-2016-0067749

(51) Int. Cl.
*H01L 27/32* (2006.01)
*G09G 3/3225* (2016.01)
*G09G 3/3233* (2016.01)

(52) U.S. Cl.
CPC ....... *H01L 27/3258* (2013.01); *G09G 3/3225* (2013.01); *G09G 3/3233* (2013.01); *H01L 27/3248* (2013.01); *G09G 2300/0426* (2013.01); *G09G 2330/10* (2013.01)

(58) Field of Classification Search
CPC ... H01L 27/32; H01L 27/325; H01L 27/3258; H01L 27/3248; G09G 3/3225; G09G 3/3233

USPC ........................................................... 257/40
See application file for complete search history.

(56) References Cited

U.S. PATENT DOCUMENTS

| 8,987,712 | B2 | 3/2015 | Saito et al. | |
| 9,035,330 | B2* | 5/2015 | Kang | H01L 27/3246 257/100 |
| 10,156,749 | B2* | 12/2018 | Cho | G02F 1/13338 |
| 2007/0052352 | A1* | 3/2007 | Im | H01L 27/3246 313/506 |

(Continued)

FOREIGN PATENT DOCUMENTS

| KR | 10-2006-0055050 A | 5/2006 |
| KR | 10-2006-0055211 A | 5/2006 |

(Continued)

*Primary Examiner* — Fazli Erdem
(74) *Attorney, Agent, or Firm* — Innovation Counsel LLP (57) ABSTRACT

In an organic light-emitting display apparatus comprising a plurality of pixels, at least one of the plurality of pixels includes a first conductive layer over a substrate, a first organic insulating layer over the first conductive layer, the first organic insulating layer comprising a first opening exposing a part of the first conductive layer, a second conductive layer over the first organic insulating layer, the second conductive layer contacting the part of the first conductive layer exposed through the first opening, a first inorganic insulating layer over the first organic insulating layer to cover the second conductive layer, the first inorganic insulating layer comprising a second opening exposing at least a part of the first organic insulating layer, and a second organic insulating layer over the first inorganic insulating layer, the second organic insulating layer contacting the first organic insulating layer through the second opening.

20 Claims, 6 Drawing Sheets

(56) References Cited

U.S. PATENT DOCUMENTS

| | | | | |
|---|---|---|---|---|
| 2009/0200931 A1* | 8/2009 | Takei | .................. | H01L 27/3246 |
| | | | | 313/504 |
| 2011/0272715 A1* | 11/2011 | Kang | .................. | H01L 27/3246 |
| | | | | 257/88 |
| 2012/0268002 A1* | 10/2012 | Osako | ................. | H01L 27/3258 |
| | | | | 313/504 |
| 2014/0166999 A1* | 6/2014 | Kim | .................... | H01L 27/3258 |
| | | | | 257/40 |
| 2015/0021565 A1* | 1/2015 | Min | .................... | H01L 51/5256 |
| | | | | 257/40 |
| 2015/0171154 A1 | 6/2015 | Kang | | |
| 2017/0131585 A1* | 5/2017 | Cho | .................... | G02F 1/13338 |
| 2017/0287996 A1* | 10/2017 | Kim | .................... | H01L 27/3258 |
| 2017/0345847 A1* | 11/2017 | Kim | .................... | H01L 27/3276 |

FOREIGN PATENT DOCUMENTS

| | | |
|---|---|---|
| KR | 10-2008-0057379 A | 6/2008 |
| KR | 10-2014-0114312 A | 9/2014 |
| KR | 10-2015-0070855 A | 6/2015 |

* cited by examiner

ORGANIC LIGHT-EMITTING DISPLAY APPARATUS

CROSS-REFERENCE TO RELATED APPLICATION

This application claims the benefit of Korean Patent Application No. 10-2016-0067749, filed on May 31, 2016, in the Korean Intellectual Property Office, the disclosure of which is incorporated herein in its entirety by reference.

BACKGROUND

1. Field

One or more embodiments relate to an organic light-emitting display apparatus.

2. Description of the Related Art

Organic light-emitting display apparatuses may include thin film transistors (TFTs), capacitors, and a plurality of wires. A substrate on which an organic light-emitting display apparatus is manufactured has a fine pattern of TFTs, capacitors, and wires. An organic light-emitting display apparatus is operated by complicated connections between the TFTs, the capacitors, and the wires.

As the demand for compact, high-resolution organic light-emitting display apparatuses has increased, so has the demand for efficient spatial arrangement, connection structure, and operating method of TFTs, capacitors, and wires included in an organic light-emitting display apparatus, and improved image quality.

SUMMARY

In a high-resolution organic light-emitting display apparatus, in order to efficiently arrange a plurality of conductive layers such as wires and electrodes in a limited space, a structure may be employed, in which conductive layers are arranged spaced apart from each other with an insulating layer therebetween and the conductive layers are electrically connected to each other by forming a contact hole in the insulating layer. In this case, an inorganic insulating layer for protecting the conductive layers and an organic insulating layer for planarizing the surfaces of the conductive layers may be arranged between the conductive layers. However, outgas generated in the organic insulating layer may not be easily discharged outwardly due to the inorganic insulating layer covering the organic insulating layer, and may be intensively discharged through a certain area where the inorganic insulating layer is discontinued. Accordingly, progressive dark spots are generated by the outgas that is intensively discharged through a certain area, thereby causing a pixel defect.

One or more embodiments include an organic light-emitting display apparatus in which a pixel defect due to a progressive dark spot may be removed or reduced by efficiently discharging outgas generated from an organic insulating layer.

Additional aspects will be set forth in part in the description which follows and, in part, will be apparent from the description, or may be learned by practice of the presented embodiments.

According to one or more embodiments, in an organic light-emitting display apparatus including a plurality of pixels, at least one of the plurality of pixels includes a first conductive layer over a substrate, a first organic insulating layer over the first conductive layer, the first organic insulating layer including a first opening exposing a part of the first conductive layer, a second conductive layer over the first organic insulating layer, the second conductive layer contacting the part of the first conductive layer exposed through the first opening, a first inorganic insulating layer over the first organic insulating layer to cover the second conductive layer, the first inorganic insulating layer including a second opening exposing at least a part of the first organic insulating layer, and a second organic insulating layer over the first inorganic insulating layer, the second organic insulating layer contacting the first organic insulating layer through the second opening.

The organic light-emitting display apparatus may further include a second inorganic insulating layer over the substrate to cover the first conductive layer, wherein the second inorganic insulating layer includes a third opening exposing a part of the first conductive layer, and the second conductive layer contacts the part of the first conductive layer exposed through the first opening and the third opening.

The second inorganic insulating layer and the first inorganic insulating layer may respectively contact the first conductive layer and the second conductive layer, the first organic insulating layer may be separated by the second inorganic insulating layer from the first conductive layer, and the second organic insulating layer may be separated by the first inorganic insulating layer from the second conductive layer.

The first inorganic insulating layer and the second inorganic insulating layer may include silicon nitride ($SiN_x$), and the first organic insulating layer and the second organic insulating layer may include polyimide (PI).

An area of the first opening may be greater than an area of the third opening, and the third opening may be arranged inside the first opening.

The organic light-emitting display apparatus may further include a thin film transistor including an active layer which includes a source region, a drain region, and a channel region connecting the source region and the drain region, and a gate electrode over the active layer to be insulated from the active layer, in which the first conductive layer may be electrically connected to the source region or the drain region.

The first inorganic insulating layer may further include a fourth opening exposing a part of the second conductive layer, and the second organic insulating layer may include a fifth opening exposing the part of the second conductive layer that is exposed by the fourth opening.

An area of the fifth opening may be greater than an area of the fourth opening, and the fourth opening may be arranged inside the fifth opening.

The organic light-emitting display apparatus may further include a pixel electrode contacting the second conductive layer through the fourth opening and the fifth opening, an intermediate layer over the pixel electrode, the intermediate layer including a light-emitting layer, and a counter electrode over the intermediate layer.

The organic light-emitting display apparatus may further include a lower power supply line on a same layer as the first conductive layer, and an upper power supply line on a same layer as the second conductive layer.

The lower power supply line and the upper power supply line may be electrically connected to each other via a contact hole included in the first organic insulating layer and the second inorganic insulating layer.

The first inorganic insulating layer may entirely cover the upper power supply line, and the second opening may correspond to a space between the second conductive layer and the upper power supply line.

The second opening may include a plurality of openings arranged in an area adjacent to the second conductive layer.

The second conductive layer may include a first layer including titanium (Ti), a second layer including aluminum (Al), and a third layer including titanium (Ti).

According to one or more embodiments, in an organic light-emitting display apparatus including a plurality of pixels, at least one of the plurality of pixels includes a first conductive layer over a substrate, a lower power supply line on a same layer as the first conductive layer and spaced apart from the first conductive layer, a first organic insulating layer over the first conductive layer and the lower power supply line, the first organic insulating layer including a first opening exposing a part of the first conductive layer and a second opening exposing a part of the lower power supply line, a second conductive layer over the first organic insulating layer, the second conductive layer contacting the part of the first conductive layer exposed through the first opening, an upper power supply line on a same layer as the second conductive layer, the upper power supply line contacting the part of the lower power supply line through the second opening, a first inorganic insulating layer over the first organic insulating layer, the first inorganic insulating layer including a first region covering the second conductive layer and a second region covering the upper power supply line and spaced apart from the first region, and a second organic insulating layer over the first inorganic insulating layer, the second organic insulating layer contacting the first organic insulating layer between the first region and the second region of the first inorganic insulating layer.

The organic light-emitting display apparatus may further include a second inorganic insulating layer over the substrate to cover the first conductive layer and the lower power supply line, the second inorganic insulating layer including a third opening exposing a part of the first conductive layer and a fourth opening exposing a part of the lower power supply line, and the second conductive layer contacts the part of the first conductive layer exposed through the first opening and the third opening, in which the upper power supply line contacts the part of the lower power supply line exposed through the second opening and the fourth opening.

The first inorganic insulating layer and the second inorganic insulating layer may include silicon nitride ($SiN_x$), and the first organic insulating layer and the second organic insulating layer may include polyimide (PI).

The second conductive layer may include a first layer including titanium (Ti), a second layer including aluminum (Al), and a third layer including titanium (Ti).

The organic light-emitting display apparatus may further include a thin film transistor including an active layer that includes a source region, a drain region, and a channel region connecting the source region and the drain region, and a gate electrode over the active layer to be insulated from the active layer, in which the first conductive layer is electrically connected to the source region or the drain region.

The organic light-emitting display apparatus may further include a pixel electrode contacting the second conductive layer, an intermediate layer over the pixel electrode, the intermediate layer including a light-emitting layer, and a counter electrode over the intermediate layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the term "and/or" includes any and all combinations of one or more of the associated listed items. Expressions such as "at least one of," when preceding a list of elements, modify the entire list of elements and do not modify the individual elements of the list.

It will be understood that when a component, such as a layer, a film, a region, or a plate, is referred to as being "on" another component, the component may be directly on the other component, or intervening components may be present thereon. Sizes of components in the drawings may be exaggerated or reduced for convenience of explanation. In other words, since sizes and thicknesses of components in the drawings are arbitrarily illustrated for convenience of explanation, the following embodiments are not limited thereto.

Although the accompanying drawings illustrate an active matrix (AM) type organic light-emitting display apparatus having a 7Tr-1Cap structure, that is, seven thin film transistors (TFTs) and one capacitor are included in one pixel, the present inventive concept is not limited thereto. Accordingly, a display apparatus may include a plurality of TFTs and one or more capacitors in one pixel, and may have various structures by further including a separate wiring or omitting a wiring shown in the drawings. The organic light-emitting display apparatus may include a plurality of pixels, each pixel denoting a minimum unit for displaying an image. The organic light-emitting display apparatus displays a desired image through a combination of the pixels.

Figure 1:
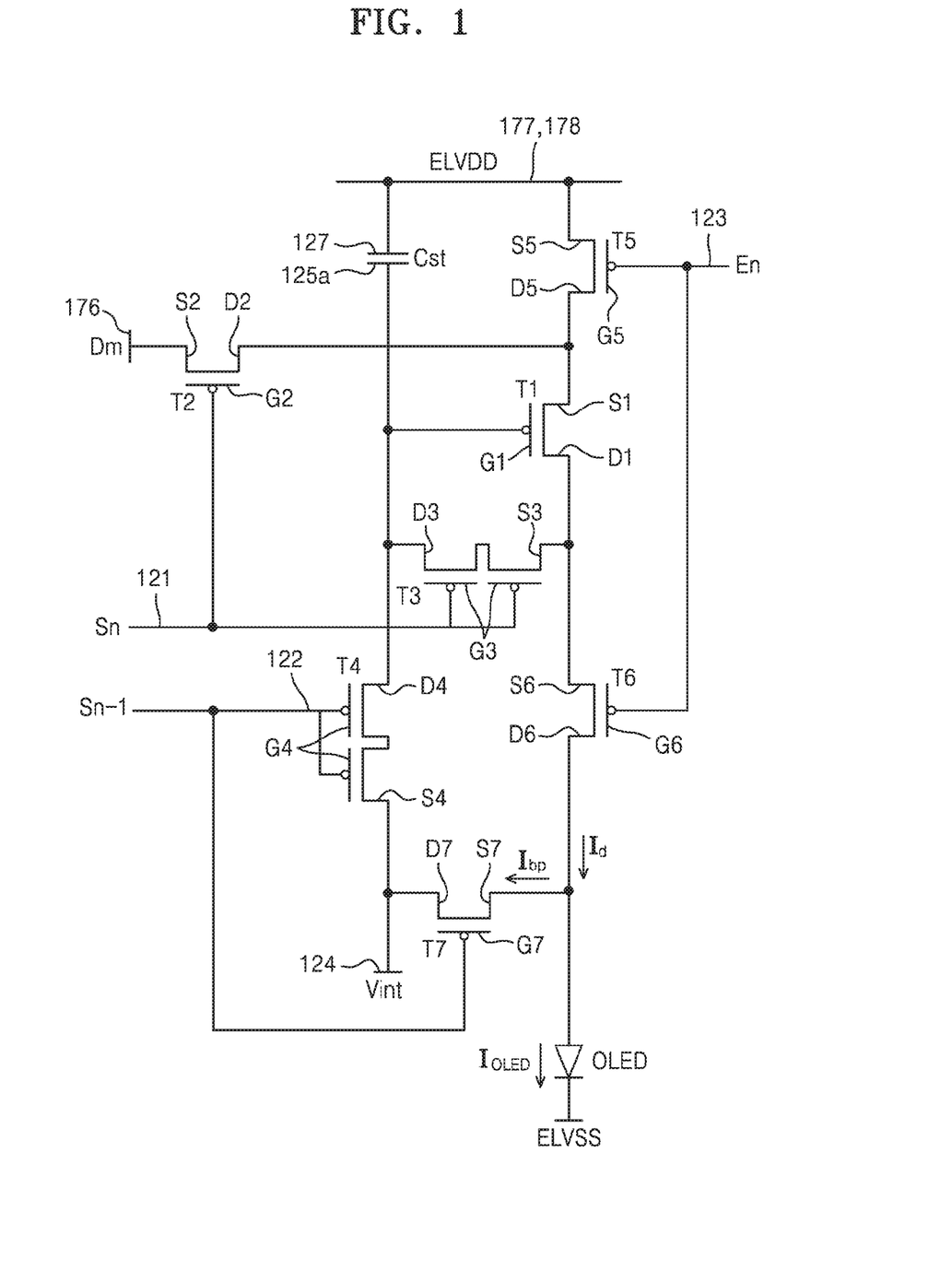
FIG. 1 is an equivalent circuit diagram of a pixel of an organic light-emitting display apparatus according to an embodiment.

FIG. 1 is an equivalent circuit diagram of one pixel of an organic light-emitting display apparatus according to an embodiment.

As illustrated in FIG. 1, one of a plurality of pixels of the organic light-emitting display apparatus according to the present embodiment may include a plurality of signal lines 121, 122, 123, 124, 176, 177, and 178, a plurality of TFTs T1, T2, T3, T4, T5, T6, and T7 connected to the signal lines, a storage capacitor Cst, and an organic light-emitting device (OLED). The signal lines 121, 122, 123, 124, 176, 177, and 178 may be shared by other pixels.

The TFT may include a driving TFT T1, a switching TFT T2, a compensation TFT T3, an initialization TFT T4, an operation control TFT T5, a light emission control TFT T6, and a bypass TFT T7.

The signal lines 121, 122, 123, 124, 176, 177, and 178 may include the scan line 121 for transmitting a scan signal Sn, the previous scan line 122 for transmitting a previous scan signal Sn−1 to the initialization TFT T4 and the bypass TFT T7, the light emission control line 123 for transmitting a light emission control signal En to the operation control TFT T5 and the light emission control TFT T6, the data line 176 for transmitting a data signal Dm crossing the scan line 121, the power supply lines 177 and 178 for transmitting a drive voltage ELVDD, which are substantially parallel to the data line 176, and an initialization voltage line 124 for transmitting an initialization voltage Vint to initialize the driving TFT T1. The power supply lines 177 and 178 may include a lower power supply line 177 and an upper power supply line 178 arranged on different layers. The lower power supply line 177 and the upper power supply line 178 may be electrically connected to each other, which is described later.

A gate electrode G1 of the driving TFT T1 is connected to a first storage conductive plate 125a of the storage capacitor Cst. A source electrode S1 of the driving TFT T1 is connected to the power supply lines 177 and 178 via the operation control TFT T5. A drain electrode D1 of the driving TFT T1 is electrically connected to a pixel electrode of the OLED via the light emission control TFT T6. The driving TFT T1 receives the data signal Dm and supplies a light emission current $I_{OLED}$ to the OLED, according to a switching operation of the switching TFT T2.

A gate electrode G2 of the switching TFT T2 is connected to the scan line 121. A source electrode S2 of the switching TFT T2 is connected to the data line 176. A drain electrode D2 of the switching TFT T2 is connected to the source electrode S1 of the driving TFT T1 and connected to the power supply lines 177 and 178 via the operation control TFT T5. The switching TFT T2 is turned on by the scan signal Sn received through the scan line 121 and performs a switching operation of transmitting the data signal Dm received through the data line 176 to the source electrode S1 of the driving TFT T1.

A gate electrode G3 of the compensation TFT T3 is connected to the scan line 121. A source electrode S3 of the compensation TFT T3 is connected to the drain electrode D1 of the driving TFT T1 and connected to a pixel electrode 191 (see FIG. 4) of the OLED via the light emission control TFT T6. A drain electrode D3 of the compensation TFT T3 is connected to the first storage conductive plate 125a of the storage capacitor Cst, a drain electrode D4 of the initialization TFT T4, and the gate electrode G1 of the driving TFT T1. The compensation TFT T3 is turned on by the scan signal Sn received through the scan line 121 to electrically connect the gate electrode G1 and the drain electrode D1 of the driving TFT T1, thereby diode-connecting the driving TFT T1.

A gate electrode G4 of the initialization TFT T4 is connected to the previous scan line 122. A source electrode S4 of the initialization TFT T4 is connected to a drain electrode D7 of the bypass TFT T7 and the initialization voltage line 124. A drain electrode D4 of the initialization TFT T4 is connected to the first storage conductive plate 125a of the storage capacitor Cst, the drain electrode D3 of the compensation TFT T3, and the gate electrode G1 of the driving TFT T1. The initialization TFT T4 is turned on by the previous scan signal Sn−1 received through the previous scan line 122 and performs an initialization operation of initializing a voltage of the gate electrode G1 of the driving TFT T1 by transmitting the initialization voltage Vint to the gate electrode G1 of the driving TFT T1.

A gate electrode G5 of the operation control TFT T5 is connected to the light emission control line 123. A source electrode S5 of the operation control TFT T5 is connected to the power supply lines 177 and 178. A drain electrode D5 of the operation control TFT T5 is connected to the source electrode S1 of the driving TFT T1 and the drain electrode D2 of the switching TFT T2.

A gate electrode G6 of the light emission control TFT T6 is connected to the light emission control line 123. A source electrode S6 of the light emission control TFT T6 is connected to the drain electrode D1 of the driving TFT T1 and the source electrode S3 of the compensation TFT T3. A drain electrode D6 of the light emission control TFT T6 is electrically connected to the source electrode S7 of the bypass TFT T7 and the pixel electrodes 191 of the OLED. The operation control TFT T5 and the light emission control TFT T6 are simultaneously turned on by the light emission control signal En received through the light emission control line 123 to transmit the drive voltage ELVDD to the OLED, thereby having the light emission current $I_{OLED}$ flowing in the OLED.

A gate electrode G7 of the bypass TFT T7 is connected to the previous scan line 122. The source electrode S7 of the bypass TFT T7 is connected to the drain electrode D6 of the light emission control TFT T6 and the pixel electrode 191 of the OLED. The drain electrode D7 of the bypass TFT T7 is connected to the initialization voltage line 124. The bypass TFT T7 receives the previous scan signal Sn−1 through the previous scan line 122 at its gate electrode G7. The previous scan signal Sn−1 is a voltage of a certain level enough to turn off the bypass TFT T7. In a state in which the bypass TFT T7 is turned off, part of a drive current $I_d$ passes through the bypass TFT T7 as a bypass current $I_{bp}$.

When displaying a black image, a minimum current of the driving TFT T1 flows as a drive current. As such, the OLED emits light, and the black image is not displayed well. The minimum current of the driving TFT T1 denotes a current under a condition in which the driving TFT T1 is turned off because a gate-source voltage $V_{GS}$ of the driving TFT T1 is less than a threshold voltage Vth. Accordingly, in order to prevent the OLED from emitting light even when the minimum current flows as the drive current, the bypass TFT T7 may allow part of the current $I_d$ flowing out from the driving TFT T1 to flow along another current path other than a current path toward the OLED, as a the bypass current $I_{bp}$. As such, as a current less than the minimum drive current, for example, about 10 pA or less, is transmitted to the OLED to turn off the driving TFT T1, the OLED is prevented from emitting light or a degree of light emission is reduced so that a black image is implemented.

When the minimum drive current to display a black image flows, the bypass current $I_{bp}$ is branched from the minimum drive current, and thus, whether the OLED emits light or a degree of light emission is greatly affected. However, when a large drive current to display a general image or a white image flows, the degree of light emission in the OLED may be hardly affected by the bypass current $I_{bp}$. Accordingly, when a drive current to display a black image flows, the light emission current $I_{OLED}$ of the OLED, which is reduced from the drive current $I_d$ by a current amount of the bypass current $I_{bp}$ that flows through the bypass TFT T7, has a current amount of a level to display a blacker black image. Accordingly, as a more accurate black brightness image is implemented by using the bypass TFT T7, a contrast ratio may be improved.

Although FIG. 1 illustrates a case in which the initialization TFT T4 and the bypass TFT T7 are connected to the previous scan line 122, the present inventive concept is not limited thereto. In another embodiment, the initialization TFT T4 is connected to the previous scan line 122 and driven by the previous scan signal Sn−1, and the bypass TFT T7 is connected to a separate wire and may be driven by a signal transmitted through the wire.

A second storage conductive plate 127 of the storage capacitor Cst is connected to the power supply lines 177 and 178. A counter electrode 193 (see FIG. 4) of the OLED is connected to a common voltage ELVSS. Accordingly, the OLED may display an image by receiving the light emission current $I_{OLED}$ from the driving TFT T1 and emitting light.

Although FIG. 1 illustrates that each of the compensation TFT T3 and the initialization TFT T4 has a dual-gate electrode, the present inventive concept is not limited thereto. For example, each of the compensation TFT T3 and the initialization TFT T4 may have a single-gate electrode. Also, various modifications are possible, for example, at least one of the TFTs T1, T2, T5, T6, and T7 other than the compensation TFT T3 and the initialization TFT T4 may have a dual-gate electrode.

A detailed operation of one pixel of an organic light-emitting display apparatus is schematically described below.

First, the previous scan signal Sn−1 of a low level is supplied through the previous scan line 122 for an initialization period. Then, in response to the previous scan signal Sn−1 of a low level, the initialization TFT T4 is turned on so that the initialization voltage Vint from the initialization voltage line 124 is transmitted to the gate electrode G1 of the driving TFT T1 via the initialization TFT T4. Accordingly, the driving TFT T1 is initialized by the initialization voltage Vint.

Then, the scan signal Sn of a low level is supplied through the scan line 121 during a data programming period. Next, in response to the scan signal Sn of a low level, the switching TFT T2 and the compensation TFT T3 are turned on. Accordingly, the driving TFT T1 is diode-connected by the compensation TFT T3 that is turned on, and is biased in a forward direction. Then, a compensation voltage Dm+Vth, which is reduced by the threshold voltage Vth (i.e., Vth is a negative (−) value) of the driving TFT T1 from the data signal Dm supplied through the data line 176, is applied to the gate electrode G1 of the driving TFT T1. The drive voltage ELVDD and the compensation voltage Dm+Vth are applied to both ends of the storage capacitor Cst, and thus, electric charges corresponding to a voltage difference between both ends is stored in the storage capacitor Cst.

During a light emission period, the light emission control signal En supplied through the light emission control line 123 is changed from a high level to a low level. Then, the operation control TFT T5 and the light emission control TFT T6 are turned on by the light emission control signal En of a low level during the light emission period. The drive current $I_d$ that is determined by the voltage difference between the voltage of the gate electrode G1 of the driving TFT T1 and the drive voltage ELVDD is generated. The light emission current $I_d$ corresponding to the difference between the drive current $I_d$ and the bypass current $I_{bp}$ is supplied to the OLED through the light emission control TFT T6. During the light emission period, the gate-source voltage $V_{GS}$ of the driving TFT T1 is maintained to be "(Dm+Vth)−ELVDD" by the storage capacitor Cst. According to a current-voltage relationship of the driving TFT T1, because the light emission current $I_{OLED}$ is proportional to "(Dm−ELVDD)$^2$" that is the square of a value obtained by deducting the threshold voltage Vth from the gate-source voltage $V_{GS}$, the light emission current $I_{OLED}$ is determined independent of the threshold voltage Vth of the driving TFT T1.

According to one embodiment, although the TFTs T1, T2, T3, T4, T5, T6, and T7 may be p-channel field effect transistors, the present inventive concept is not limited thereto, and at least some of the TFTs T1, T2, T3, T4, T5, T6, and T7 may be n-channel field effect transistors.

In the following description, a detailed structure of one pixel of the organic light-emitting display apparatus of FIG. 1 is described with reference to FIG. 2.

Figure 2:
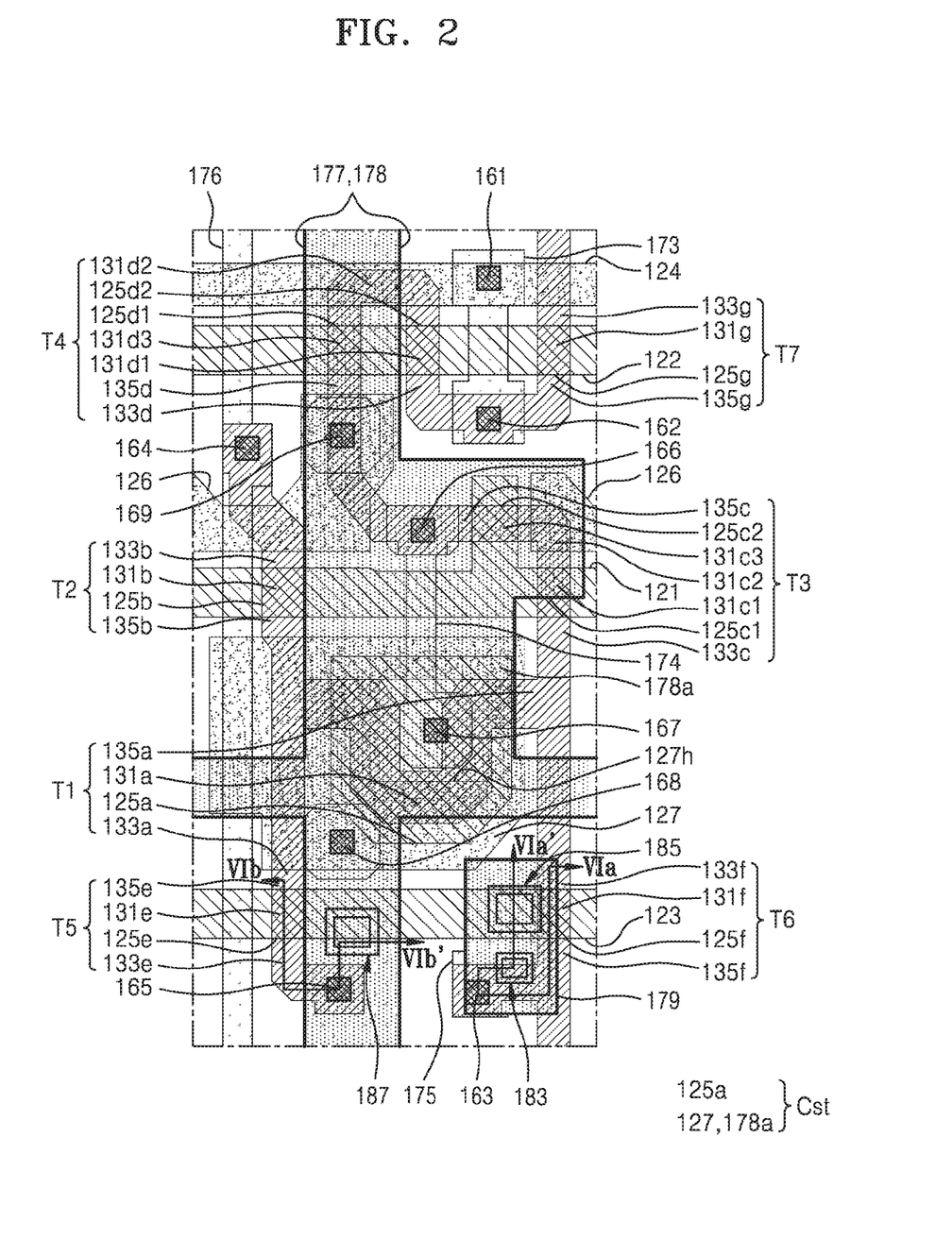
FIG. 2 is a plan view schematically illustrating positions of a plurality of thin film transistors and capacitors in the pixel of FIG. 1.

FIG. 2 is a plan view schematically illustrating positions of a plurality of thin film transistors and capacitors in the pixel of FIG. 1. FIG. 2 illustrates arrangements of semiconductor layers and conductive layers. An insulating layer may be interposed between a semiconductor layer (conductive layer) and a conductive layer arranged in different layers. Contact holes are formed in parts of the insulating layers, and thus, the conductive layers arranged in different layers may be electrically connected to each other in a vertical direction.

A pixel of an organic light-emitting display apparatus according to the present embodiment may include the scan line 121 the previous scan line 122, the light emission control line 123, and the initialization voltage line 124, which are arranged in a row direction, and through which the scan signal Sn, the previous scan signal Sn−1, the light emission control signal En, and the initialization voltage Vint are respectively applied. The pixel of an organic light-emitting display apparatus according to the present embodiment may include the data line 176 and the power supply lines 177 and 178, which intersect the scan line 121, the previous scan line 122, the light emission control line 123, and the initialization voltage line 124 and respectively apply the data signal Dm and the drive voltage ELVDD to the pixel.

Figure 4:
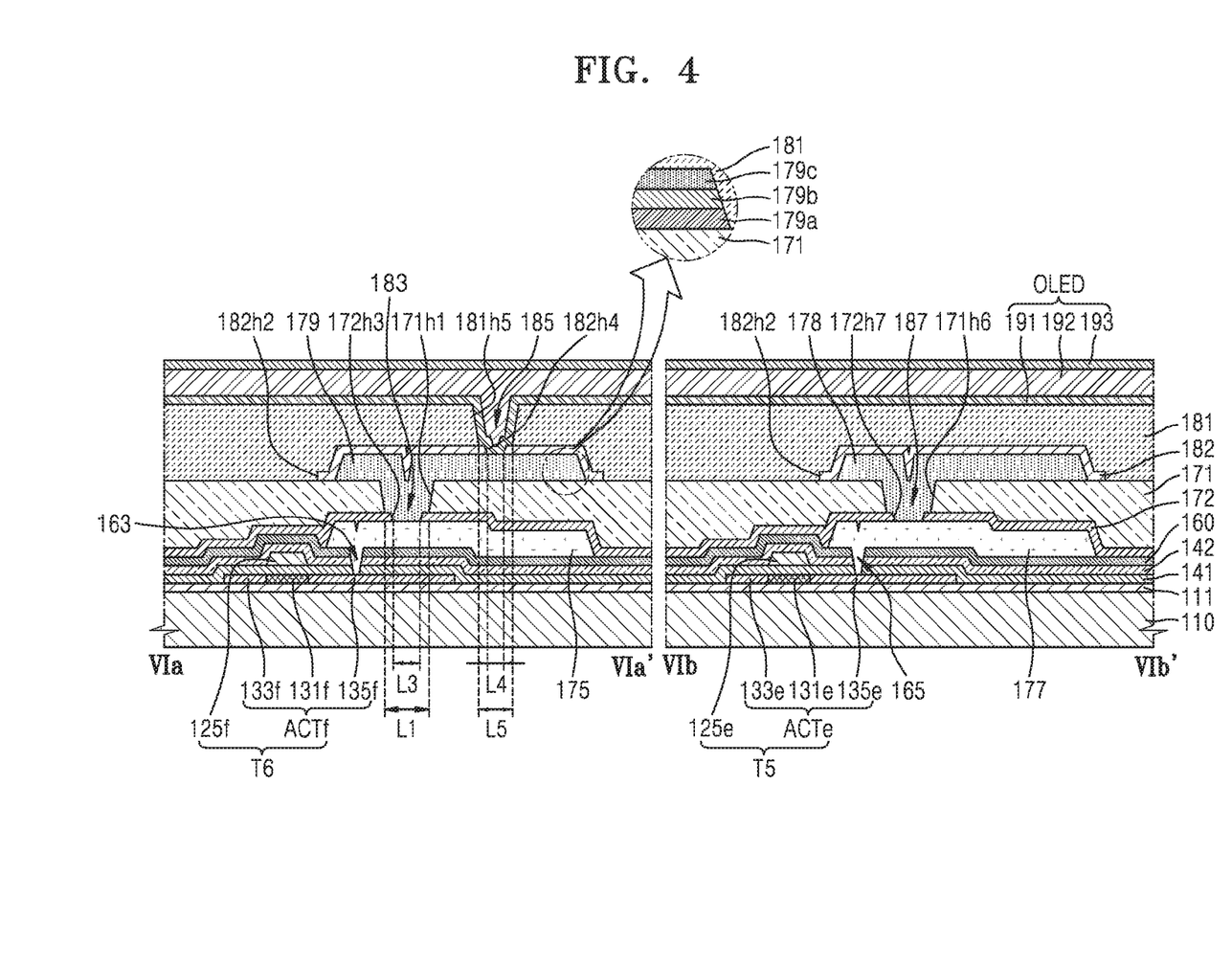
FIG. 4 is a cross-sectional view taken along lines VIa-VIa' and VIb-VIb' of FIG. 2.

Also, the pixel may include the driving TFT T1, the switching TFT T2, the compensation TFT T3, the initialization TFT T4, the operation control TFT T5, the light emission control TFT T6, the bypass TFT T7, the storage capacitor Cst, and the OLED (see FIG. 4).

The driving TFT T1, the switching TFT T2, the compensation TFT T3, the initialization TFT T4, the operation control TFT T5, the light emission control TFT T6, and the bypass TFT T7 are formed along an active layer that may have a curved shape in various forms. The active layer may include a driving active layer corresponding to the driving TFT T1, a switching active layer corresponding to the switching TFT T2, a compensation active layer corresponding to the compensation TFT T3, an initialization active layer corresponding to the initialization TFT T4, an operation control active layer ACTe (see FIG. 4) corresponding to the operation control TFT T5, a light emission control active layer ACTf (see FIG. 4) corresponding to the light emission control TFT T6, and a bypass active layer corresponding to the bypass TFT T7.

The active layer may include polysilicon. The active layer may include, for example, a channel region that is not doped with impurities and thus has semiconductor properties, and a source region and a drain region that are located at opposite sides of the channel region and doped with impurities and thus have conductivity. The impurities may vary according to the type of a TFT, and N-type impurities or P-type impurities may be used.

The source region or the drain region, which is formed by doping, may be interpreted to be a source electrode or a drain electrode of a TFT. In other words, for example, a driving source electrode may correspond to a driving source region 133a that is doped with impurities in vicinity of a driving channel region 131a of the driving active layer, and a driving drain electrode may correspond to a driving drain region 135a that is doped with impurities in vicinity of the driving channel region 131a. Also, parts of the active layer corresponding to an area between TFTs are doped with impurities and may be wires electrically connecting the TFTs.

A pixel of an organic light-emitting display apparatus according to the present embodiment may include the storage capacitor Cst. The storage capacitor Cst may include the first storage conductive plate 125a and the second storage conductive plate 127, which are arranged facing each other. A second insulating layer 142 is interposed between the first storage conductive plate 125a and the second storage conductive plate 127. According to an embodiment, the first storage conductive plate 125a may simultaneously function as a driving gate electrode 125a. In other words, the driving gate electrode 125a and the first storage conductive plate 125a may be one body.

The first storage conductive plate 125a may have an island shape isolated from an adjacent pixel. The first storage conductive plate 125a may be formed of the same material and on the same layer as the scan line 121, the previous scan line 122, and the light emission control line 123.

For reference, a switching gate electrode 125b and compensation gate electrodes 125c1 and 125c2 may be parts of the scan line 121 intersecting the active layer or parts protruding from the scan line 121. Initialization gate electrodes 125d1 and 125d2 and a bypass gate electrode 125g are parts of the previous scan line 122 intersecting the active layer or parts protruding from the previous scan line 122. An operation control gate electrode 125e and a light emission control gate electrode 125f may be parts of the light emission control line 123 intersecting the active layer or parts protruding from the light emission control line 123.

The second storage conductive plate 127 may be connected to each other in adjacent pixels, and may be formed of the same material and on the same layer as the initialization voltage line 124 and/or a shield layer 126. A storage opening 127h may be formed in the second storage conductive plate 127. Accordingly, the first storage conductive plate 125a and a compensation drain region 135c of the compensation TFT T3 may be electrically connected to each other by a connection member 174 that is described later. The second storage conductive plate 127 may be connected to the lower power supply line 177 via a contact hole 168 formed in an interlayer insulating layer 160.

The driving TFT T1 may include the driving active layer and the driving gate electrode 125a. The driving active layer may include the driving source region 133a, the driving drain region 135a, and the driving channel region 131a connecting the driving source region 133a and the driving drain region 135a, The driving gate electrode 125a may also perform a function of the first storage conductive plate 125a as described above. The driving channel region 131a of the driving active layer overlaps the gate electrode 125a in plan view. The driving source region 133a and the driving drain region 135a are located in opposite directions with respect to the driving channel region 131a. The driving source region 133a of the driving TFT T1 is connected to a switching drain region 135b and an operation control drain region 135e, which are described later. The driving drain region 135a is connected to a compensation source region 133c and a light emission control source region 133f, which are described later.

The switching TFT T2 may include the switching active layer and the switching gate electrode 125b. The switching active layer may include a switching channel region 131b, a switching source region 133b, and the switching drain region 135b. The switching source region 133b may be electrically connected to the data line 176 via a contact hole 164 formed in a first insulating layer 141, the second insulating layer 142, and the interlayer insulating layer 160. The switching TFT T2 is used as a switching element to select a pixel to emit light. The switching gate electrode 125b is connected to the scan line 121. The switching source region 133b is connected to the data line 176 as described above. The switching drain region 135b is connected to the driving TFT T1 and the operation control TFT T5.

The compensation TFT T3 may include the compensation active layer and the compensation gate electrodes 125c1 and 125c2. The compensation active layer may include compensation channel regions 131c1, 131c2, and 131c3, the compensation source region 133c, and the compensation drain region 135c. The compensation gate electrodes 125c1 and 125c2, which form a dual-gate electrode including the first compensation gate electrode 125c1 and the second compensation gate electrode 125c2, may prevent or reduce generation of a leakage current. The compensation drain region 135c of the compensation TFT T3 may be connected to the first storage conductive plate 125a through the connection member 174. The compensation channel regions 131c1, 131c2, and 131c3 may include a part 131c1 corresponding to the first compensation gate electrode 125c1, a part 131c3 corresponding to the second compensation gate electrode 125c2, and a part 131c2 between the parts 131c1 and 131c3. The shield layer 126 that is formed of the same material and on the same layer as the initialization voltage line 124 and the second storage conductive plate 127 is located on the part 131c2 between the parts 131c1 and 131c3. The shield layer 126 may be connected to the lower power supply line 177 via a contact hole 169 formed in the interlayer insulating layer 160. Since the part 131c2 between the parts 131c1 and 131c3 is a conductive part doped with impurities, when the shield layer 126 does not exist, the part 131a2 and the data line 176 arranged adjacent thereto may formed a parasitic capacitor, Since the data line 176 applies data signals having different intensities according to brightness to be implemented in a pixel, capacitance of the parasitic capacitor may be changed. The compensation TFT T3 is electrically connected to the driving TFT T1. As the capacitance of the parasitic capacitor formed in the compensation TFT T3 is changed, the drive current $I_d$ and the light emission current $I_{OLED}$ are changed. Consequently, the brightness of light emitted from the pixel may be changed.

However, when the shield layer 126 connected to the lower power supply line 177 and applying a constant voltage is arranged on the part 131c2 between the parts 131c1 and 131c3, the part 131c2 and the shield layer 126 may substantially form a parasitic capacitor having a certain capacitance. Since the parasitic capacitor formed by the part 131c2 and the shield layer 126 has a very large capacitance compared to the parasitic capacitor formed by the part 131$c$2 and the data line 176, a change in the capacitance of the parasitic capacitor formed by the part 131$c$2 and the shield layer 126 according to a change of the data signal applied to the data line 176 may be very small, compared to the capacitance of the parasitic capacitor formed by the part 131$c$2 and the shield layer 126, so as to be maintained at a negligible level. Accordingly, a change in the brightness of light emitted from a pixel, which may be generated by a change in the capacitance of the parasitic capacitor, may be prevented or reduced.

The connection member 174 may be formed of the same material and on the same layer as the data line 176 and the lower power supply line 177. One end of the connection member 174 is connected to the compensation drain region 135$c$ and an initialization drain region 135$d$ via a contact hole 166 formed in the first insulating layer 141, the second insulating layer 142, and the interlayer insulating layer 160. The other end of the connection member 174 is connected to the first storage conductive plate 125$a$ via a contact hole 167 formed in the second insulating layer 142 and the interlayer insulating layer 160. The other end of the connection member 174 may be connected to the first storage conductive plate 125$a$ via the storage opening 127$h$ formed in the second storage conductive plate 127. The initialization TFT T4 may include the initialization active layer and the initialization gate electrodes 125$d$1 and 125$d$2. The initialization active layer may include initialization channel regions 131$d$1, 131$d$2, and 131$d$3, an initialization source region 133$d$, and the initialization drain region 135$d$. The initialization gate electrodes 125$d$1 and 125$d$2, which form a dual-gate electrode including a first initialization gate electrode 125$d$1 and a second initialization gate electrode 125$d$2, may prevent or reduce generation of a leakage current. The initialization channel regions 131$d$1, 131$d$2, and 131$d$3 may include a region 131$d$3 corresponding to the first initialization gate electrode 125$d$1, a region 131$d$1 corresponding to the second initialization gate electrode 125$d$2, and a region 131$d$2 therebetween.

The initialization source region 133$d$ is connected to the initialization voltage line 124 through an initialization connection line 173. One end of the initialization connection line 173 is connected to the initialization voltage line 124 via a contact hole 161 formed in the second insulating layer 142 and the interlayer insulating layer 160. The other end of the initialization connection line 173 may be connected to the initialization source region 133$d$ via a contact hole 162 formed in the first insulating layer 141, the second insulating layer 142, and the interlayer insulating layer 160.

The operation control TFT T5 may include the operation control active layer ACTe of FIG. 4 and the operation control gate electrode 125$e$. The operation control active layer ACTe may include an operation control channel region 131$e$, an operation control source region 133$e$, and the operation control drain region 135$e$. The operation control source region 133$e$ may be electrically connected to the lower power supply line 177 via a contact hole 165 formed in the first insulating layer 141, the second insulating layer 142, and the interlayer insulating layer 160.

The light emission control TFT T6 may include the light emission control active layer ACTf and the light emission control gate electrode 125$f$. The light emission control active layer ACTf may include a light emission control channel region 131$f$, the light emission control source region 133$f$, and a light emission control drain region 135$f$. A first conductive layer 175 is arranged on the light emission control TFT T6. The first conductive layer 175 may be connected to the light emission control drain region 135$f$ of the light emission control active layer ACTf via a contact hole 163 formed in the first insulating layer 141, the second insulating layer 142, and the interlayer insulating layer 160. The first conductive layer 175 may be formed of the same material and on the same layer as the data line 176 and the lower power supply line 177. The first conductive layer 175 is electrically connected to a second conductive layer 179 as described later, and consequently, electrically connected to the pixel electrode 191 of the OLED.

The bypass TFT T7 may include the bypass active layer and the bypass gate electrode 125$g$. The bypass active layer may include a bypass source region 133$g$, a bypass drain region 135$g$, and a bypass channel region 131$g$. The bypass drain region 135$g$ is connected to the initialization source region 133$d$ of the initialization TFT T4 and thus connected to the initialization voltage line 124 through the initialization connection line 173. The bypass source region 133$g$ is electrically connected to the pixel electrode 191 of the OLED.

The second conductive layer 179 is arranged on the first conductive layer 175. The second conductive layer 179 may be connected to the first conductive layer 175 via a contact hole 183 formed in a first organic insulating layer 171 (see FIG. 4) and a second inorganic insulating layer 172 (see FIG. 4). The pixel electrode 191 of the OLED is arranged on the second conductive layer 179. The pixel electrode 191 may be connected to the second conductive layer 179 via a contact hole 185 formed in a second organic insulating layer 181 and in a first inorganic insulating layer 182 (see FIG. 4) located between the second conductive layer 179 and the pixel electrode 191. In other words, the first conductive layer 175 and the second conductive layer 179 may be intermediate connection layers to connect the light emission control drain region 135$f$ of the light emission control active layer ACTf and the pixel electrode 191. The second conductive layer 179 may be formed of the same material and on the same layer as the upper power supply line 178. The upper power supply line 178 may be connected to the lower power supply line 177 via a contact hole 187 formed in the second organic insulating layer 181 and the first inorganic insulating layer 182. The power supply lines 177 and 178 may include the lower power supply line 177 and the upper power supply line 178, which are electrically connected to each other. In the above structure, as a space in the pixel occupied by the power supply lines 177 and 178 is reduced, resistance of the power supply lines 177 and 178 may be reduced. In other words, as a voltage drop of the power supply lines 177 and 178 is decreased, quality of an image may be improved.

Figure 3:
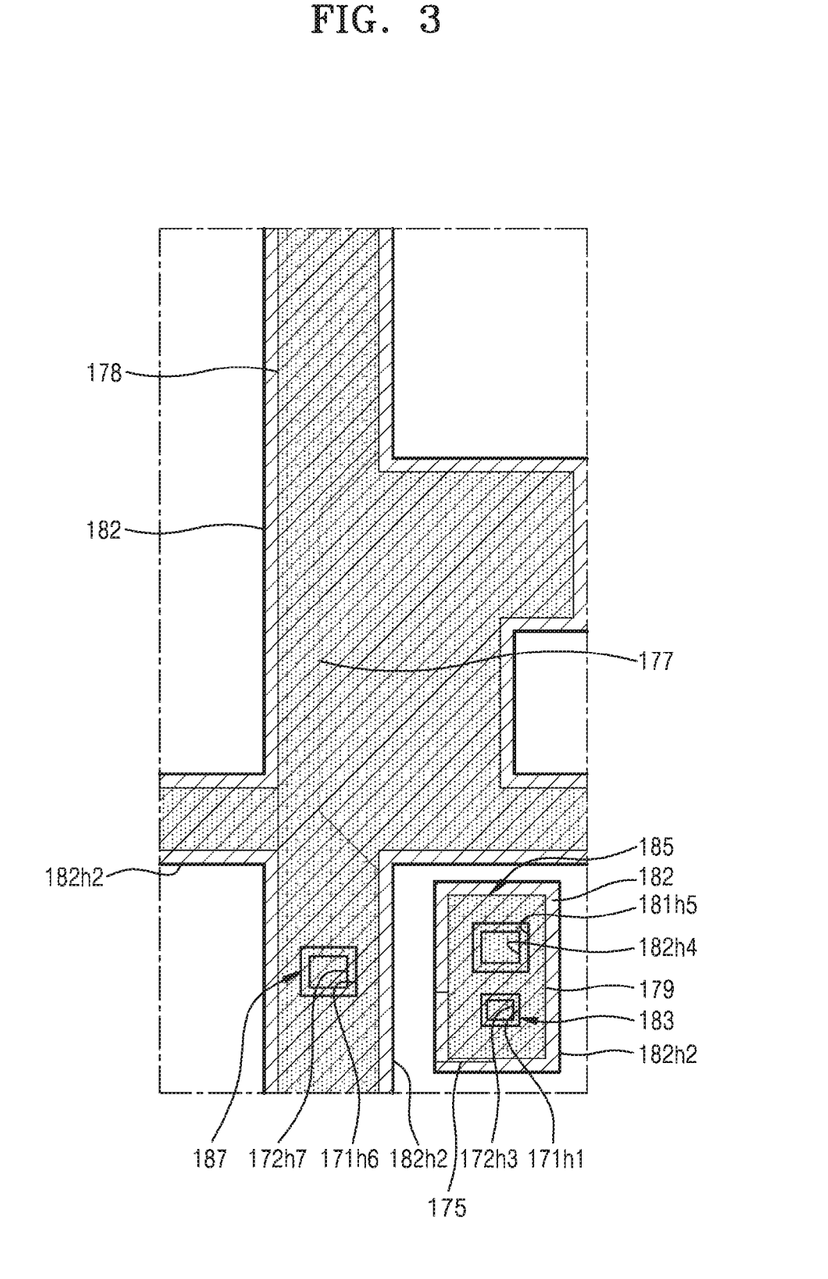
FIG. 3 is a schematic plan view of a first conductive layer, a second conductive layer, and a first inorganic insulating layer included in the organic light-emitting display apparatus of FIG. 1.

FIG. 3 is a schematic plan view of a first conductive layer, a second conductive layer, and a first inorganic insulating layer included in the organic light-emitting display apparatus of FIG. 1. FIG. 4 is a cross-sectional view taken along lines VIa-VIa' and VIb-VIb' of FIG. 2.

Referring to FIGS. 3 and 4, an organic light-emitting display apparatus according to an embodiment may include a plurality of pixels. At least one of the pixels may include the first conductive layer 175 arranged over a substrate 110, a first organic insulating layer 171 including a first opening 171$h$1 exposing a part of the first conductive layer 175, the second conductive layer 179 arranged over the first organic insulating layer 171 and contacting the part of first conductive layer 175 exposed through the first opening 171$h$1, the first inorganic insulating layer 182 arranged over the first organic insulating layer 171 to cover the second conductive layer 179 and having a second opening 182$h$2 exposing at least a part of the first organic insulating layer 171, and the second organic insulating layer 181 arranged over the first inorganic insulating layer 182 and contacting the first organic insulating layer 171 via the second opening 182h2.

The substrate 110 may be formed of various materials such as a glass material, a metal material, or a plastic material. According to an embodiment, the substrate 110 may be a flexible substrate. For example, the substrate 110 may include polymer resin such as polyethersulphone (PES), polyacrylate (PAR), polyetherimide (PEI), polyethylenenapthalate (PEN), polyethyleneterepthalate (PET), polyphenylenesulfide (PPS), polyallylate, polyimide (PI), polycarbonate (PC), or cellulose acetate propionate (CAP).

The substrate 110 may include a display area configured to display an image and a non-display area outside the display area. A plurality of pixels may be arranged in the display area. FIGS. 2 and 3 illustrate one pixel arranged in the display area of the substrate 110, The TFTs T1, T2, T3, T4, T5, T6, and T7 (see FIG. 2) and the OLED connected to at least one of the TFTs may be arranged over the substrate 110. In the following description, the arrangement of the first conductive layer 175, the lower power supply line 177 arranged on the same layer as the first conductive layer 175, the second conductive layer 179, the upper power supply line 178 arranged on the same layer as the second conductive layer 179 and the first inorganic insulating layer 182 covering the above elements is described below with reference to FIGS. 3 and 4.

Referring to FIGS. 3 and 4, the operation control TFT T5 and the light emission control TFT T6 are arranged over the substrate 110. Other TFTs included in one pixel are not illustrated in FIG. 4. The operation control TFT T5 and the light emission control TFT T6 are mainly described in a partial cross-sectional structure of FIG. 2. The operation control TFT T5 may include the operation control active layer ACTe and the operation control gate electrode 125e. The light emission control TFT T6 may include the light emission control active layer ACTf and the light emission control gate electrode 125f. The active layers ACTe and ACTf may include amorphous silicon, polycrystalline silicon, or an organic semiconductor material, and include the source regions 133e and 133f, the drain regions 135e and 135f, and the channel region 131e and 131f connecting the source regions 133e and 133f and the drain regions 135e and 135f. The gate electrodes 125e and 125f are respectively arranged above the active layers ACTe and ACTf. The source regions 133e and 133f and the drain regions 135e and 135f are electrically communicated according to signals applied to the gate electrodes 125e and 125f. The gate electrodes 125e and 125f may be formed of at least one of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in a single layer or as multilayers, depending on factors such as close contact with an adjacent layer, surface planarization of a stacked layer, and processability.

To secure insulation of the active layers ACTe and ACTf and the gate electrodes 125e and 125f, the first insulating layer 141 including an inorganic material such as silicon oxide, silicon nitride, and/or silicon oxynitride may be interposed between the active layers ACTe and ACTf and the gate electrodes 125e and 125f. In addition, the second insulating layer 142 including an inorganic material such as silicon oxide, silicon nitride, and/or silicon oxynitride may be arranged over the gate electrodes 125e and 125f. The interlayer insulating layer 160 may be arranged over the second insulating layer 142. The interlayer insulating layer 160 may include an inorganic material such as silicon oxide, silicon nitride, and/or silicon oxynitride.

A buffer layer 111 including an inorganic material such as silicon oxide, silicon nitride, and/or silicon oxynitride may be interposed between the TFTs T5 and T6 and the substrate 110. The buffer layer 111 may improve smoothness of an upper surface of the substrate 110 or may prevent or reduce intrusion of impurities from the substrate 110 into the active layers ACTe and ACTf.

The first conductive layer 175 and the lower power supply line 177 are arranged over the interlayer insulating layer 160. The first conductive layer 175 and the lower power supply line 177 may be formed of at least one material of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in a single layer or as multilayers, depending on factors such as conductivity. For example, the first conductive layer 175 and the lower power supply line 177 may be a stacked structure of titanium (Ti)/aluminum (AO/titanium (Ti). The first conductive layer 175 may be electrically connected to the light emission control drain region 135f of the light emission control active layer ACTf via the contact hole 163 formed in the first insulating layer 141, the second insulating layer 142, and the interlayer insulating layer 160, to be adjacent to the light emission control TFT T6. The lower power supply line 177 may be electrically connected to the operation control source region 133e of the operation control active layer ACTe via the contact hole 165 formed in the first insulating layer 141, the second insulating layer 142, and the interlayer insulating layer 160. The second inorganic insulating layer 172 may be arranged over the interlayer insulating layer 160 and cover the first conductive layer 175 and the lower power supply line 177. The first organic insulating layer 171 may be arranged over the second inorganic insulating layer 172. The second inorganic insulating layer 172 and the first organic insulating layer 171 may continuously extend from above the first conductive layer 175 to above the lower power supply line 177, and may directly contact the first conductive layer 175 and the lower power supply line 177.

The second inorganic insulating layer 172 may include an inorganic material such as silicon oxide, silicon nitride, and/or silicon oxynitride and may cover the first conductive layer 175 and the lower power supply line 177, thereby protecting the metal forming the first conductive layer 175 and the lower power supply line 177 from being oxidized. The first organic insulating layer 171 may include an organic material such as acryl, benzocyclobutene (BCB), polyimide, or hexamethyldisiloxane (HMDSO), may perform a function to planarize a surface by removing a step formed between the first conductive layer 175 and the lower power supply line 177. According to an embodiment, the second inorganic insulating layer 172 may be formed of silicon nitride ($SiN_x$), and the first organic insulating layer 171 may be formed of polyimide (PI).

The second conductive layer 179 and the upper power supply line 178 are arranged over the first organic insulating layer 171. The second conductive layer 179 and the upper power supply line 178 may be formed of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in a single layer or as multilayers, depending on factors such as conductivity. For example, the second conductive layer 179 may be a stacked structure of a first layer 179a including titanium (Ti), a second layer 179b arranged on the first layer 179a and including aluminum (Al), and a third layer 179c arranged on the second layer 179b and including titanium (Ti). The first conductive layer 175 may also have the same structure as the second conductive layer 179. However, the present inventive concept is not limited thereto, and, depending on factors such as conductivity, the first conductive layer 175 and the second conductive layer 179 may be formed of various types of metals or metal compounds.

The second inorganic insulating layer 172 may include a third opening 172h3 exposing a part of the first conductive layer 175. The first organic insulating layer 171 may include the first opening 171h1 exposing a part of the first conductive layer 175 that is exposed by the third opening 172h3, The second conductive layer 179 may be electrically connected to the first conductive layer 175 via the first opening 171h1 and the third opening 172h3. The first opening 171h1 and the third opening 172h3 may be interpreted to be the contact hole 183 that connects the first conductive layer 175 and the second conductive layer 179. A width L1 of the first opening 171h1 may be greater than a width L3 of the third opening 172h3. In other words, as illustrated in FIG. 3, an area of the first opening 171h1 is greater than that of the third opening 172h3. The third opening 172h3 may be arranged inside the first opening 171h1.

The second inorganic insulating layer 172 may further include a seventh opening 172h7 exposing a part of the lower power supply line 177. The first organic insulating layer 171 may further include a sixth opening 171h6 exposing a part of the lower power supply line 177 that is exposed by the seventh opening 172h7. The upper power supply line 178 may be electrically connected to the lower power supply line 177 through the sixth opening 171h6 and the seventh opening 172h7. In other words, as the power supply lines 177 and 178 are configured to include the lower power supply line 177 and the upper power supply line 178 that are arranged in different layers, resistance of the power supply lines 177 and 178 may be reduced while occupying a reduced space. The sixth opening 171h6 and the seventh opening 172h7 may be interpreted to be the contact hole 187 that connects the lower power supply line 177 and the upper power supply line 178.

The upper power supply line 178 may include a protruding area 178a (see FIG. 2) that protrudes toward an area overlapping the second storage conductive plate 127 (see FIG. 2) in plan view. The upper power supply line 178 is electrically connected to the lower power supply line 177 via the contact hole 187 formed in the first organic insulating layer 171 and the second inorganic insulating layer 172. The lower power supply line 177 is electrically connected to the second storage conductive plate 127 via the contact hole 168 formed in the interlayer insulating layer 160. Consequently, the upper power supply line 178 may be electrically connected to the second storage conductive plate 127. In other words, the protruding area 178a of the upper power supply line 178 may function as one conductive plate with the second storage conductive plate 127. According to the above configuration, the protruding area 178a may function as the storage capacitor Cst with the first conductive plate 125a (see FIG. 2, and thus the capacitance of the storage capacitor Cst may be stably provided. The storage capacitor Cst is formed to overlap, in plan view, the driving TFT T1 that occupies a large area in a pixel. Accordingly, a space occupied by the storage capacitor Cst in a pixel may be minimized, but the storage capacitor Cst may have a high capacitance.

The first inorganic insulating layer 182 covering the second conductive layer 179 and the upper power supply line 178 may be arranged over the first organic insulating layer 171. The first inorganic insulating layer 182 may include an inorganic material such as silicon oxide, silicon nitride, and/or silicon oxynitride. As the first inorganic insulating layer 182 covers the second conductive layer 179 and the upper power supply line 178, the metal forming the second conductive layer 179 and the upper power supply line 178 may be protected from being oxidized. For example, the first inorganic insulating layer 182 may include silicon nitride $SiN_x$. The first inorganic insulating layer 182 may include the second opening 182h2 arranged around the second conductive layer 179. The second opening 182h2 may correspond to a space between the second conductive layer 179 and the upper power supply line 178. In other words, the first inorganic insulating layer 182 may include a first region covering the second conductive layer 179 and a second region covering the upper power supply line 178 and spaced apart from the first region. The first region may directly contact the second conductive layer 179, and the second region may directly contact the upper power supply line 178.

When the conductive layer such as the second conductive layer 179 and the upper power supply line 178 arranged over the first organic insulating layer 171 is lifted, a crack may be generated in the first inorganic insulating layer 182 covering the conductive layer. When the first inorganic insulating layer 182 does not include the second opening 182h2, outgas generated from the first organic insulating layer 171 may be intensively discharged through the cracks generated in the first inorganic insulating layer 182 toward the second organic insulating layer 181. In this case, an agglomeration may be formed in the second organic insulating layer 181 due to the intensive discharge of the outgas and develop into a progressive dark spot, thereby causing a pixel defect. However, the first inorganic insulating layer 182 according to the present embodiment may include the second opening 182h2 exposing the first organic insulating layer 171, and thus, the outgas generated from the first organic insulating layer 171 may be smoothly discharged through the second opening 182h2 without concentrating in a particular area. Accordingly, the pixel defect due to the generation of dark spots may be removed or reduced.

The second organic insulating layer 181 is arranged over the first inorganic insulating layer 182. The first organic insulating layer 171 and the second organic insulating layer 181 may directly contact each other via the second opening 182h2 included in the first inorganic insulating layer 182. In other words, the second organic insulating layer 181 may directly contact the first organic insulating layer 171 between the first region and the second region of the first inorganic insulating layer 182. The second organic insulating layer 181 may include an organic material such as acryl, benzocyclobutene (BCB), polyimide, or hexamethyldisiloxane (HMDSO), and may be formed of, for example, polyimide. The second organic insulating layer 181 contacts the first inorganic insulating layer 182, and may be separated from the second conductive layer 179 and the upper power supply line 178 by the first inorganic insulating layer 182.

The first inorganic insulating layer 182 may include a fourth opening 182h4 that exposes a part of the second conductive layer 179. The second organic insulating layer 181 may include a fifth opening 181h5 that exposes a part of the second conductive layer 179 exposed by the fourth opening 182h4. A width L5 of the fifth opening 181h5 may be greater than a width L4 of the fourth opening 182h4. In other words, as illustrated in FIG. 3, an area of the fifth opening 181h5 is greater than that of the fourth opening 182h4, and the fourth opening 182h4 may be arranged inside the fifth opening 181h5.

The pixel electrode 191 of the OLED may be electrically connected to the second conductive layer 179 via the fourth opening 182h4 and the fifth opening 181h5. The fourth opening 182h4 and the fifth opening 181h5 may be interpreted to be the contact hole 185 that connects the second conductive layer 179 and the pixel electrode 191.

The OLED including the pixel electrode 191, an intermediate layer 192 arranged over the pixel electrode 191 and including a light-emitting layer, and a counter electrode 193 arranged over the intermediate layer 192 is arranged over the second organic insulating layer 181. The pixel electrode 191 may be electrically connected to the light emission control drain region 135f of the light emission control active layer ACTf through the second conductive layer 179 and the first conductive layer 175.

The pixel electrode 191 may be formed to be a transparent or semi-transparent electrode or a reflective electrode. When the pixel electrode 191 is formed to be a transparent or semi-transparent electrode, the pixel electrode 191 may include a transparent conductive layer. The transparent conductive layer may include at least one of indium tin oxide (ITO), indium zinc oxide (IZO), zinc oxide (ZnO), indium oxide ($In_2O_3$), indium gallium oxide (IGO), and aluminum zinc oxide (AZO). In this case, the pixel electrode 191 may further include a transflective layer, in addition to the transparent conductive layer, to improve light transmission efficiency. The transflective layer may include at least one of Ag, Mg, Al, Pt, Pd, Au, Ni, Nd, Ir, Cr, Li, Ca, and Yb and may be formed in a thin film of several to tens of nanometers. When the pixel electrode 191 is formed to be a reflective electrode, the pixel electrode 191 may include a reflective film formed of Ag, Mg, Al, Pt, Pd, Au, Ni, Nd, Ir, Cr, and a compound thereof and a transparent conductive layer arranged above and/or under the reflective film. The transparent conductive layer may include at least one of ITO, IZO, ZnO, $In_2O_3$, indium oxide, IGO, and AZO. However, the present inventive concept is not limited thereto, and the pixel electrode 191 may be formed of various materials. Also, the structure of the pixel electrode 191 may be variously modified to, for example, a single layer or as multilayers. Although not illustrated in the drawings, a pixel defining film (not shown) including an opening that exposes at least a part of the pixel electrode 191 may be arranged over the pixel electrode 191.

The intermediate layer 192 arranged over the pixel electrode 191 may include a light emitting layer. The intermediate layer 192 may further include at least one of a hole injection layer (HIL), a hole transport layer (HTL), an electron transport layer (ETL), and an electron injection layer (EIL).

The intermediate layer 192 is not limited thereto and may have various structures. The intermediate layer 192 may include an integral layer over the pixel electrodes 191 arranged in the respective pixels and may include a layer patterned to correspond to each of the pixel electrodes 191.

The counter electrode 193 is formed integrally over a plurality of pixels and may correspond to the pixel electrodes 191. The counter electrode 193 may be formed to be a transparent or semi-transparent electrode or a reflective electrode. When the counter electrode 193 is formed to be a transparent or semi-transparent electrode, the counter electrode 193 may include at least one of Ag, Al, Mg, Li, Ca, Cu, LiF/Ca, LiF/Al, MgAg, and CaAg and may be formed in a thin film of several to tens of nanometers. When the counter electrode 193 is formed to be a reflective electrode, the counter electrode 193 may include at least one of Ag, Al, Mg, Li, Ca, Cu, LiF/Ca, LiF/Al, MgAg, and CaAg. In this case, the counter electrode 913 may be configured to have a high reflectance by sufficiently increasing the thickness of the material. The structure and material of the counter electrode 193 are not limited thereto, and various modifications thereof are possible.

Although not illustrated in the drawings, a sealing member (not shown) for sealing the OLED may be arranged over the counter electrode 193. For example, the sealing member may be a thin film encapsulation layer including an inorganic film and an organic film.

In the organic light-emitting display apparatus according to the above-described embodiment, since the second opening 182h2 exposing the first organic insulating layer 171 is formed in the first inorganic insulating layer 182 covering the second conductive layer 179, the outgas generated from the first organic insulating layer 171 is efficiently discharged through the second opening 182h2 so that a pixel defect due to progressive dark spots may be removed or reduced.

Figure 5:
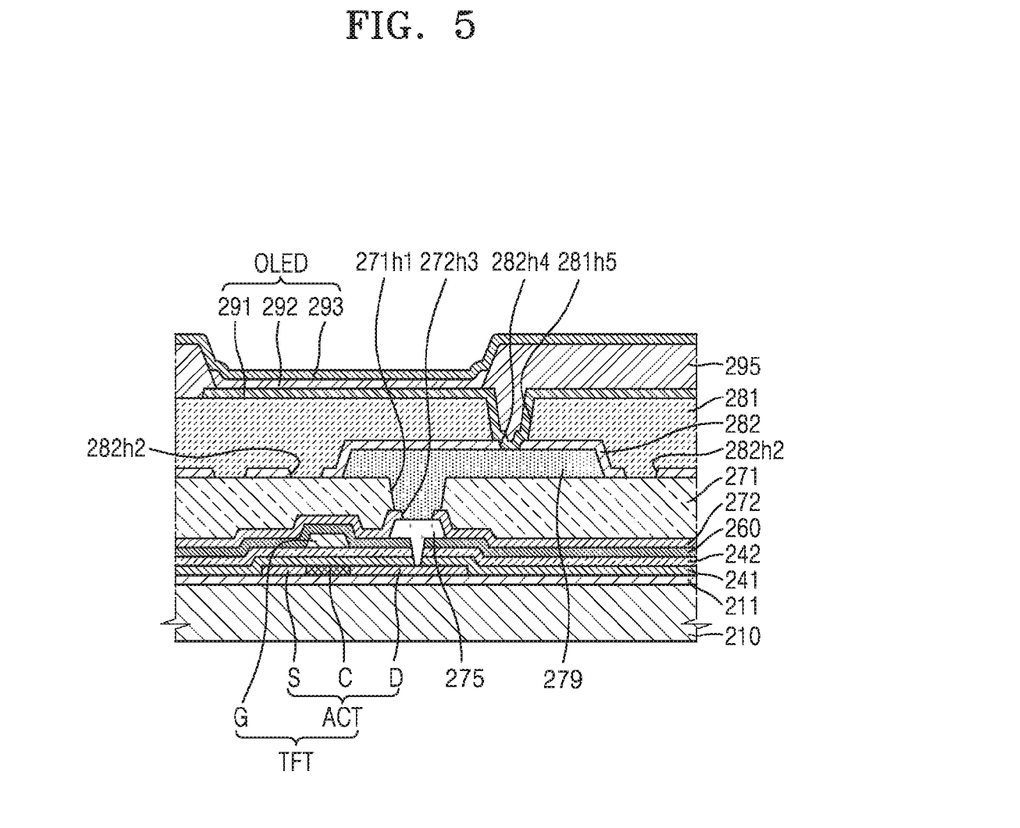
FIG. 5 is a schematic cross-sectional view of an organic light-emitting display apparatus according to another embodiment.
Figure 6:
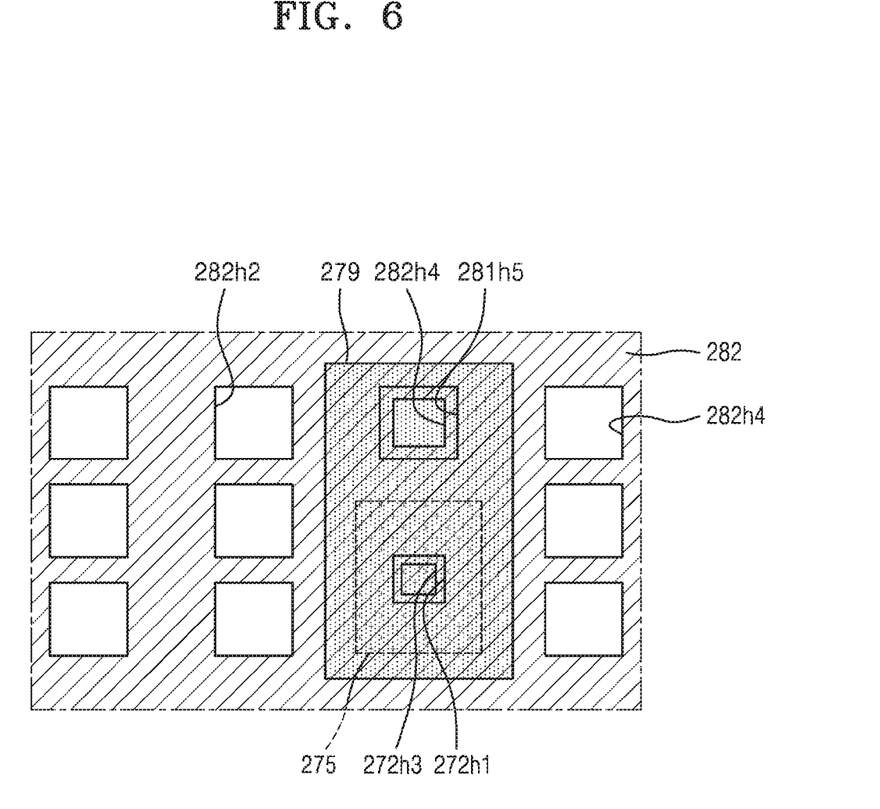
FIG. 6 is a schematic plan view of a partial structure of the organic light-emitting display apparatus of FIG. 5.

FIG. 5 is a schematic cross-sectional view of an organic light-emitting display apparatus according to another embodiment. FIG. 6 is a schematic plan view of a partial structure of the organic light-emitting display apparatus of FIG. 5.

Referring to FIGS. 5 and 6, a TFT is arranged over a substrate 210, and the TFT may include a gate electrode G and an active layer ACT that includes a source region S, a drain region D, and a channel region C connecting the source and drain regions S and D. To secure insulation between the active layer ACT and the gate electrode G, a first insulating layer 241 including an inorganic material such as silicon oxide, silicon nitride, and/or silicon oxynitride may be interposed between the active layer ACT and the gate electrode G. In addition, a second insulating layer 242 including an inorganic material such as silicon oxide, silicon nitride, and/or silicon oxynitride may be arranged on the gate electrode G. An interlayer insulating layer 260 may be arranged on the second insulating layer 242. The interlayer insulating layer 260 may include an inorganic material such as silicon oxide, silicon nitride, and/or silicon oxynitride. A buffer layer 211 including the inorganic material such as silicon oxide, silicon nitride, and/or silicon oxynitride may be interposed between the TFT and the substrate 210.

A first conductive layer 275 is arranged over the interlayer insulating layer 260. For example, the first conductive layer 275 may be a stacked structure of titanium (Ti)/aluminum (Al)/titanium (Ti). The first conductive layer 275 may be electrically connected to the drain region D of the active layer ACT through a contact hole formed in the first insulating layer 241, the second insulating layer 242, and the interlayer insulating layer 260, to be adjacent to the TFT. A second inorganic insulating layer 272 covering the first conductive layer 275 may be arranged over the interlayer insulating layer 260. A first organic insulating layer 271 may be arranged over the second inorganic insulating layer 272.

The second inorganic insulating layer 272 may include silicon nitride ($SiN_x$) and cover the first conductive layer 275, thereby protecting metal forming the first conductive layer 275 from being oxidized. The first organic insulating layer 271 may include polyimide and may perform a function of planarizing a surface by removing a step formed by the first conductive layer 275.

A second conductive layer 279 is arranged over the first organic insulating layer 271. The second conductive layer 279 may be a stacked structure of a first layer including titanium (Ti), a second layer arranged on the first layer and including aluminum (Al), and a third layer arranged on the second layer and including titanium (Ti).

The second inorganic insulating layer 272 may include a third opening 272h3 that exposes a part of the first conductive layer 275. The first organic insulating layer 271 may include a first opening 271h1 that exposes the part of the first conductive layer 275 exposed by the third opening 272h3, The second conductive layer 279 may be electrically connected to the first conductive layer 275 via the first opening 271h1 and the third opening 272h3.

A first inorganic insulating layer 282 covering the second conductive layer 279 may be arranged over the first organic insulating layer 271. The first inorganic insulating layer 282 may include an inorganic material such as silicon oxide, silicon nitride, and/or silicon oxynitride and may cover the second conductive layer 279, thereby protecting the metal forming the second conductive layer 279 from being oxidized. For example, the first inorganic insulating layer 282 may include silicon nitride ($SiN_x$). The first inorganic insulating layer 282 may include a second opening 282h2 arranged around the second conductive layer 279, and the second opening 282h2 may be plurally provided. Although FIG. 6 illustrates a case in which the second opening 282h2 is rectangular, the present inventive concept is not limited thereto, and the second opening 282h2 may have various shapes such as a circle, an oval, a pentagon, etc. Also, the number of the second openings 282h2 is not limited.

When the second conductive layer 279 arranged over the first organic insulating layer 271 is lifted, a crack may be generated in the first inorganic insulating layer 282 covering the second conductive layer 279 and the first organic insulating layer 271. When the first inorganic insulating layer 282 does not include the second opening 282h2, outgas generated from the first organic insulating layer 271 may be intensively discharged toward a second organic insulating layer 281 through a crack generated in the first inorganic insulating layer 282. In this case, an agglomeration may be formed in the second organic insulating layer 281 due to the intensive discharge of the outgas develop into a progressive dark spot, thereby causing a pixel defect. However, the first inorganic insulating layer 282 according to the present embodiment may include the second openings 282h2 exposing the first organic insulating layer 271, and thus, the outgas generated from the first organic insulating layer 271 may be smoothly discharged through the second openings 282h2 without concentrating in a particular area. Accordingly, the pixel defect due to the generation of dark spots may be removed or reduced.

The second organic insulating layer 281 is arranged over the first inorganic insulating layer 282. The first organic insulating layer 271 and the second organic insulating layer 281 may directly contact each other through the second opening 282h2 included in the first inorganic insulating layer 282. The second organic insulating layer 281 may include an organic material such as acryl, benzocyclobutene (BCB), polyimide, or hexamethyldisiloxane (HMDSO), and may be formed of, for example, polyimide. The second organic insulating layer 281 contacts the first inorganic insulating layer 282, and may be separated from the second conductive layer 279 by the first inorganic insulating layer 282.

The first inorganic insulating layer 282 may include a fourth opening 282h4 exposing a part of the second conductive layer 279. The second organic insulating layer 281 may include a fifth opening 281h5 exposing the part of the second conductive layer 279 that is exposed by the fourth opening 282h4. A pixel electrode 291 of the OLED may be electrically connected to the second conductive layer 279 through the fourth opening 282h4 and the fifth opening 281h5.

The pixel electrode 291 is arranged over the second organic insulating layer 281. A pixel defining film 295 covering an edge area of the pixel electrode 291 may be arranged over the pixel electrode 291. The OLED includes an intermediate layer 292 arranged over the pixel electrode 291 exposed by the pixel defining film 295 and including a light-emitting layer and a counter electrode 293 arranged over the intermediate layer 292. The pixel electrode 291 may be electrically connected to the drain region D of the active layer ACT through the second conductive layer 279 and the first conductive layer 275.

In the organic light-emitting display apparatus according to the above-described embodiment, since the second openings 282h2 exposing the first organic insulating layer 271 are formed in the first inorganic insulating layer 282 covering the second conductive layer 279, the outgas generated from the first organic insulating layer 271 is efficiently discharged through the second openings 282h2 so that a pixel defect due to progressive dark spots may be removed or reduced.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising a plurality of pixels, wherein at least one of the plurality of pixels comprises:
   a first conductive layer over a substrate;
   a first organic insulating layer over the first conductive layer, the first organic insulating layer comprising a first opening exposing a part of the first conductive layer;
   a second conductive layer over the first organic insulating layer, the second conductive layer contacting the part of the first conductive layer exposed through the first opening;
   a first inorganic insulating layer over the first organic insulating layer to cover the second conductive layer, the first inorganic insulating layer comprising a second opening exposing at least a part of the first organic insulating layer; and
   a second organic insulating layer over the first inorganic insulating layer, the second organic insulating layer being provided in one-piece, being formed of a same material, overlapping at least a center of the second conductive layer and contacting the first organic insulating layer through the second opening.

2. The organic light-emitting display apparatus of claim 1, further comprising a second inorganic insulating layer over the substrate to cover the first conductive layer, wherein the second inorganic insulating layer comprises a third opening exposing a part of the first conductive layer, and the second conductive layer contacts the part of the first conductive layer exposed through the first opening and the third opening.

3. The organic light-emitting display apparatus of claim 2, wherein the second inorganic insulating layer and the first inorganic insulating layer respectively contact the first conductive layer and the second conductive layer, the first organic insulating layer is separated by the second inorganic insulating layer from the first conductive layer, and the second organic insulating layer is separated by the first inorganic insulating layer from the second conductive layer.

4. The organic light-emitting display apparatus of claim 2, wherein the first inorganic insulating layer and the second inorganic insulating layer include silicon nitride (SiNx), and the first organic insulating layer and the second organic insulating layer include polyimide (PI).

5. The organic light-emitting display apparatus of claim 2, wherein an edge of the first opening surrounds an edge of the third opening, and the third opening is arranged inside the first opening.

6. The organic light-emitting display apparatus of claim 1, further comprising a thin film transistor comprising an active layer which comprises a source region, a drain region, and a channel region connecting the source region and the drain region, and a gate electrode over the active layer to be insulated from the active layer,
wherein the first conductive layer is electrically connected to the source region or the drain region.

7. The organic light-emitting display apparatus of claim 1, wherein the first inorganic insulating layer further comprises a fourth opening exposing a part of the second conductive layer, and the second organic insulating layer comprises a fifth opening exposing the part of the second conductive layer that is exposed by the fourth opening.

8. The organic light-emitting display apparatus of claim 7, wherein an edge of the fifth opening surrounds an edge of the fourth opening, and the fourth opening is arranged inside the fifth opening.

9. The organic light-emitting display apparatus of claim 7, further comprising:
a pixel electrode contacting the second conductive layer through the fourth opening and the fifth opening;
an intermediate layer over the pixel electrode, the intermediate layer comprising a light-emitting layer; and
a counter electrode over the intermediate layer.

10. The organic light-emitting display apparatus of claim 1, further comprising:
a lower power supply line on a same layer as the first conductive layer; and
an upper power supply line on a same layer as the second conductive layer.

11. The organic light-emitting display apparatus of claim 10, wherein the lower power supply line and the upper power supply line are electrically connected to each other via a contact hole included in the first organic insulating layer and the second inorganic insulating layer.

12. The organic light-emitting display apparatus of claim 10, wherein the first inorganic insulating layer entirely covers the upper power supply line, and the second opening corresponds to a space between the second conductive layer and the upper power supply line.

13. The organic light-emitting display apparatus of claim 1, wherein the second opening comprises a plurality of openings arranged in an area adjacent to the second conductive layer.

14. The organic light-emitting display apparatus of claim 1, wherein the second conductive layer comprises a first layer including titanium (Ti), a second layer including aluminum (Al), and a third layer including titanium (Ti).

15. An organic light-emitting display apparatus comprising a plurality of pixels, wherein at least one of the plurality of pixels comprises:
a first conductive layer over a substrate;
a lower power supply line on a same layer as the first conductive layer and spaced apart from the first conductive layer;
a first organic insulating layer over the first conductive layer and the lower power supply line, the first organic insulating layer comprising a first opening exposing a part of the first conductive layer and a second opening exposing a part of the lower power supply line;
a second conductive layer over the first organic insulating layer, the second conductive layer contacting the part of the first conductive layer exposed through the first opening;
an upper power supply line on a same layer as the second conductive layer, the upper power supply line contacting the part of the lower power supply line through the second opening;
a first inorganic insulating layer over the first organic insulating layer to cover the second conductive layer, the first inorganic insulating layer comprising a first region covering the second conductive layer and a second region covering the upper power supply line and spaced apart from the first region; and
a second organic insulating layer over the first inorganic insulating layer, the second organic insulating layer being provided in one-piece, being formed of a same material, overlapping at least a center of the second conductive layer and contacting the first organic insulating layer between the first region and the second region of the first inorganic insulating layer.

16. The organic light-emitting display apparatus of claim 15, further comprising a second inorganic insulating layer over the substrate to cover the first conductive layer and the lower power supply line, the second inorganic insulating layer comprising a third opening exposing a part of the first conductive layer and a fourth opening exposing a part of the lower power supply line,
wherein the second conductive layer contacts the part of the first conductive layer exposed through the first opening and the third opening, and the upper power supply line contacts the part of the lower power supply line exposed through the second opening and the fourth opening.

17. The organic light-emitting display apparatus of claim 16, wherein the first inorganic insulating layer and the second inorganic insulating layer include silicon nitride (SiNx), and the first organic insulating layer and the second organic insulating layer include polyimide (PI).

18. The organic light-emitting display apparatus of claim 15, wherein the second conductive layer comprises a first layer including titanium (Ti), a second layer including aluminum (Al), and a third layer including titanium (Ti).

19. The organic light-emitting display apparatus of claim 15, further comprising a thin film transistor comprising an active layer that comprises a source region, a drain region, and a channel region connecting the source region and the drain region, and a gate electrode over the active layer to be insulated from the active layer, wherein the first conductive layer is electrically connected to the source region or the drain region.

20. The organic light-emitting display apparatus of claim 15, further comprising:

a pixel electrode contacting the second conductive layer;

an intermediate layer over the pixel electrode, the intermediate layer comprising a light-emitting layer; and a counter electrode over the intermediate layer.

* * * * *